(12) United States Patent
Whitney et al.

(10) Patent No.: US 6,449,759 B1
(45) Date of Patent: Sep. 10, 2002

(54) SYSTEM AND METHOD FOR AUTOMATIC INSERTION AND PLACEMENT OF REPEATER BUFFERS ON AN INTEGRATED CIRCUIT FLOOR PLAN

(75) Inventors: Mark G. Whitney, Danville, CA (US); Sridhar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/515,067

(22) Filed: Feb. 28, 2000

(51) Int. Cl.$^7$ .............................................. G06F 17/50
(52) U.S. Cl. ............................................. 716/10; 716/6
(58) Field of Search ................................ 716/1, 2, 4, 5, 716/6, 8, 9, 10, 11

(56) References Cited

U.S. PATENT DOCUMENTS

| | | | |
|---|---|---|---|
| 5,838,580 A | * 11/1998 | Srivatsa | 364/489 |
| 5,910,747 A | 6/1999 | Matta et al. | 327/415 |
| 5,926,397 A | * 7/1999 | Yamanouchi | 364/491 |
| 6,145,116 A | * 11/2000 | Tawada | 716/6 |

OTHER PUBLICATIONS

Culetu et al., "A Practical Repeater Insertion Method in High Speed VLSI Circuits," 1998 ACM/DAC, pp. 392–395.* van Ginneken, "Buffer Placement in Distributed RC-tree Networks for Minimal Elmore Delay," 1990 IEEE, pp. 865–868.*

* cited by examiner

Primary Examiner—Matthew Smith
Assistant Examiner—Leigh Marie Garbowski
(74) Attorney, Agent, or Firm—LaRiviere, Grubman & Payne, LLP

(57) ABSTRACT

A computer aided design system and method for placing repeater buffers on a floor plan of an integrated circuit chip. The system includes a repeater placement tool that provides a near optimal placement of repeaters on the floor plan of a chip. The tool utilizes chip design netlist data indicating need for optimization to further decrease propagation delays in the design, wherein the data is manipulated by an algorithm which uses a combination of software programs that generate an approximate geometric placement of repeaters, that iteratively and heuristically improves the basic geometric layout, and that assigns, rule-based repeater type to each repeater, optimally determined to ensure that the strength, load, and other characteristics of the repeater buffers are correct, given the repeater location and the topology and loads of the nets.

8 Claims, 7 Drawing Sheets

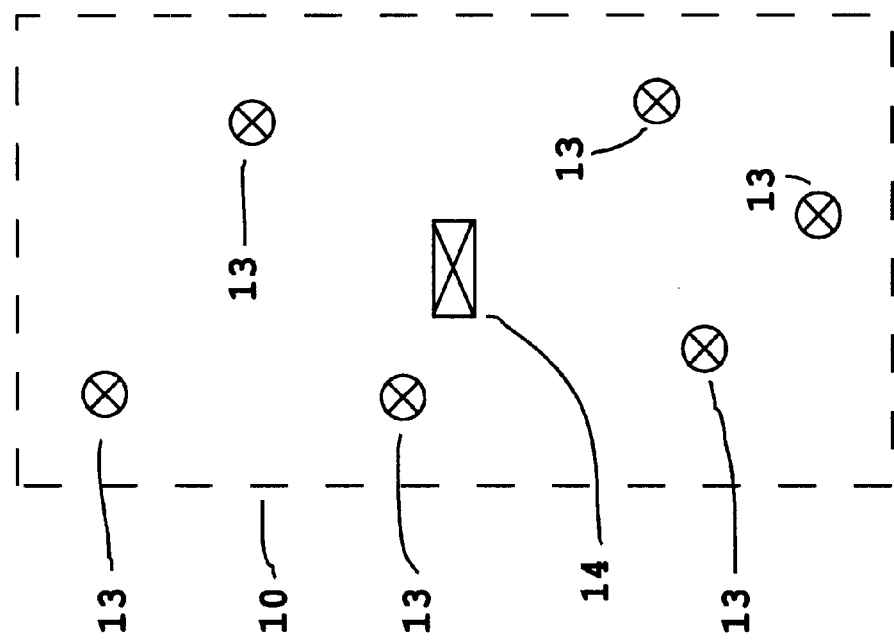
Figure 2.0
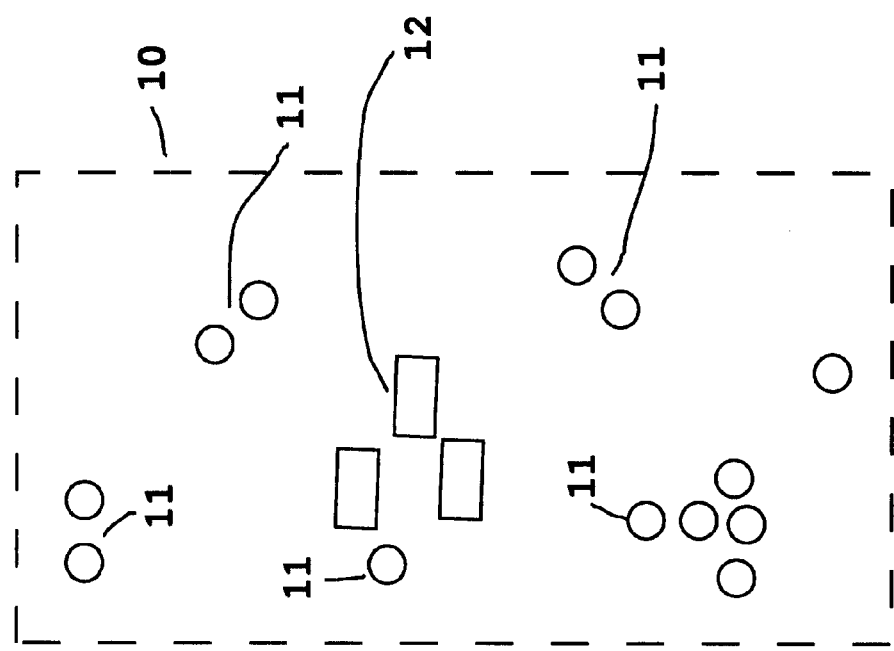
Figure 1.0

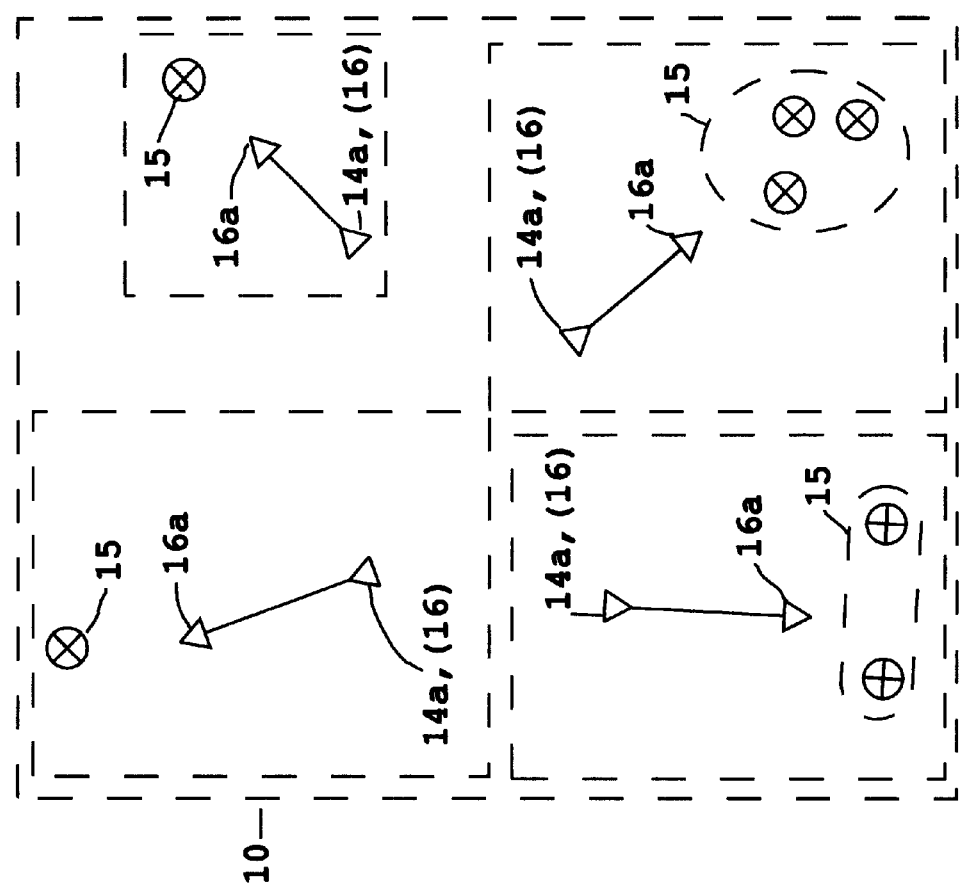
Figure 4.0
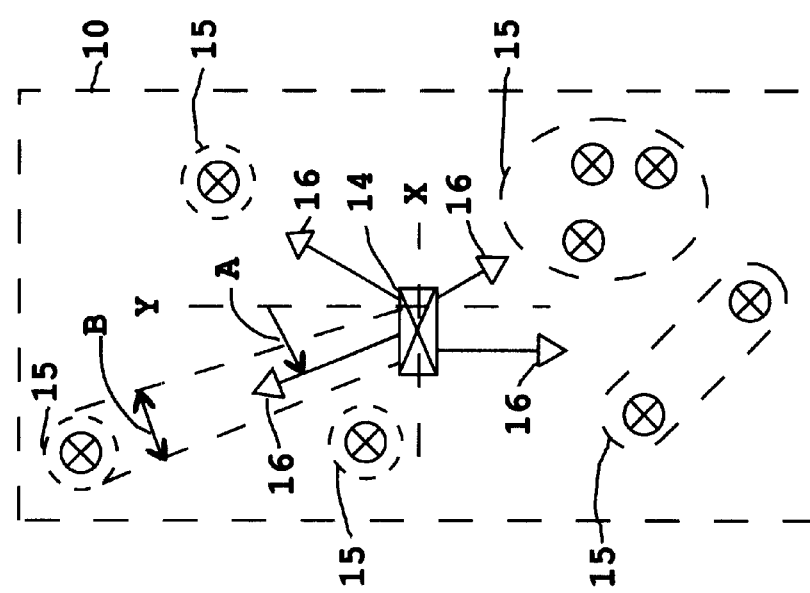
Figure 3.0

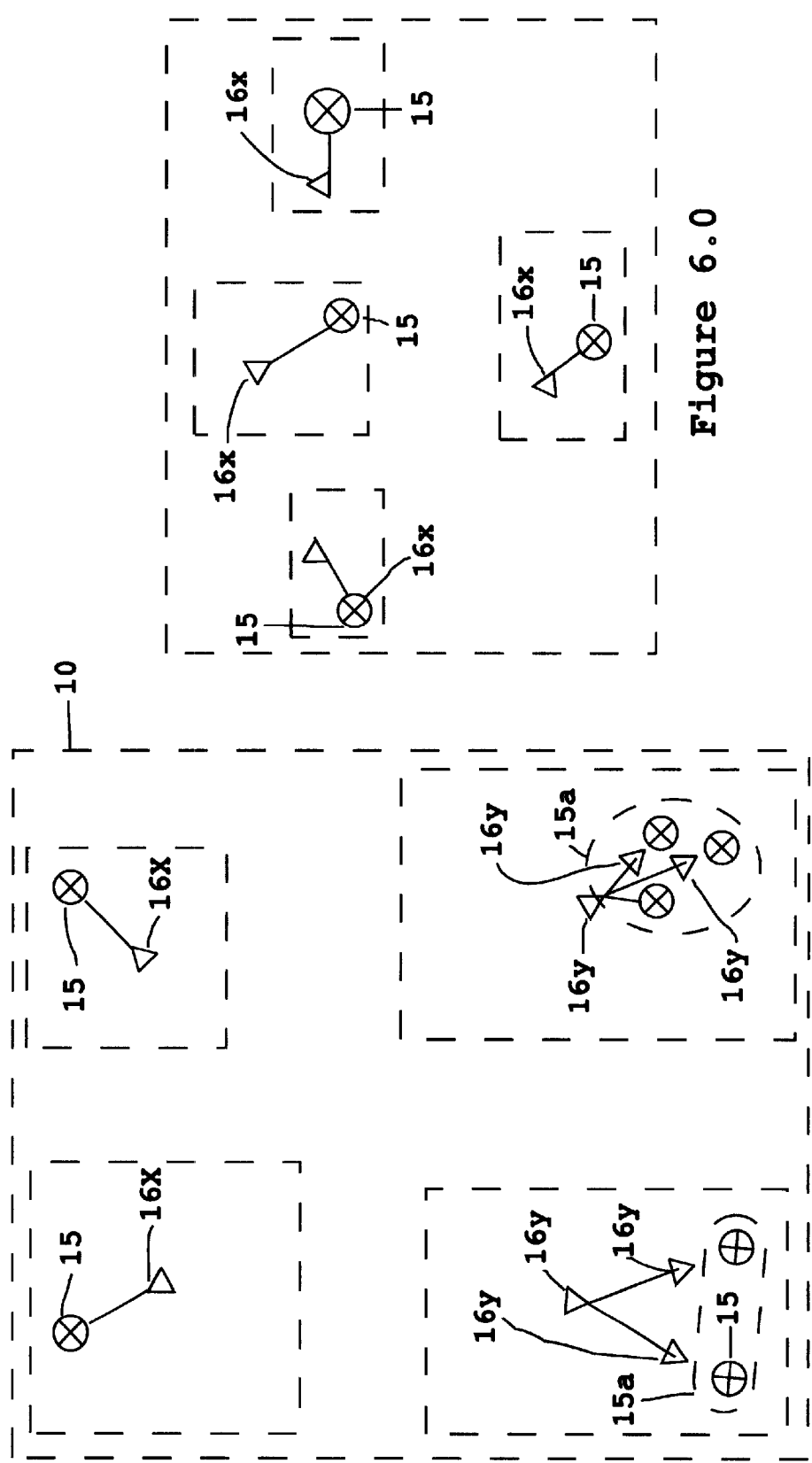

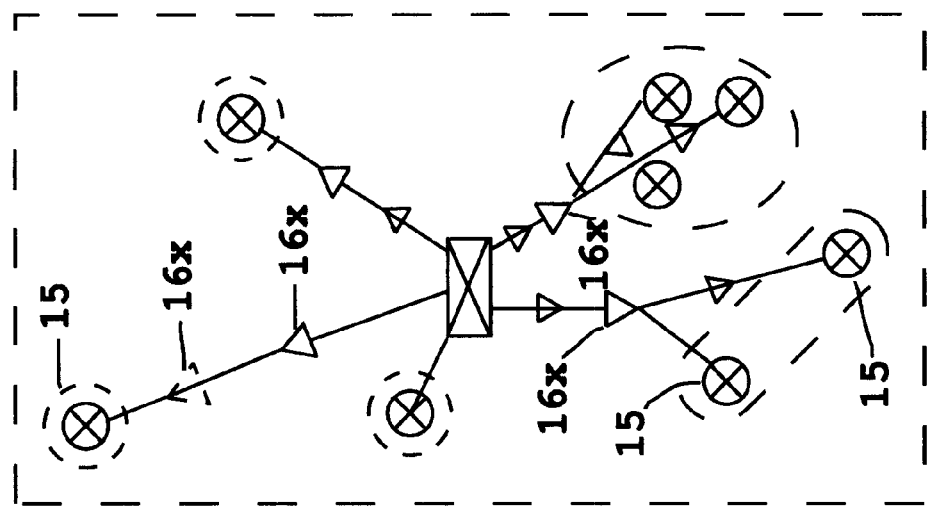
Figure 8.0
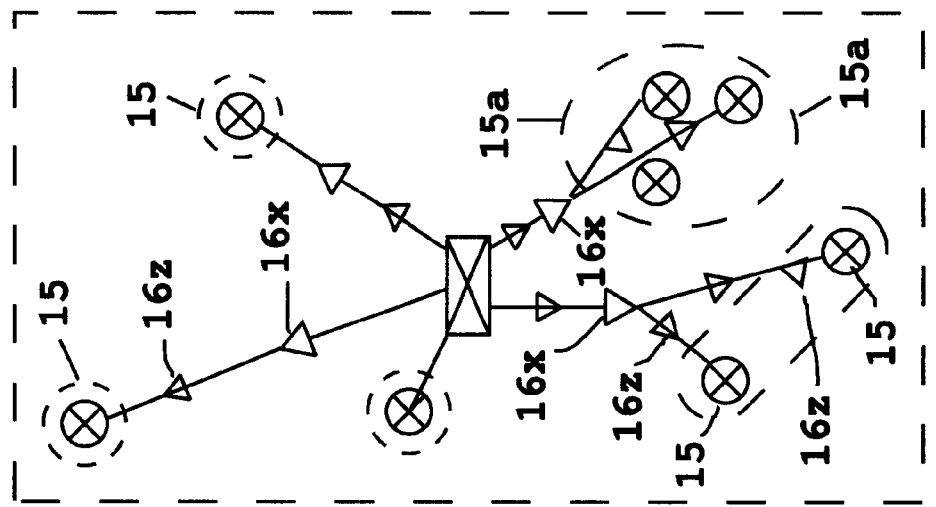
Figure 7.0

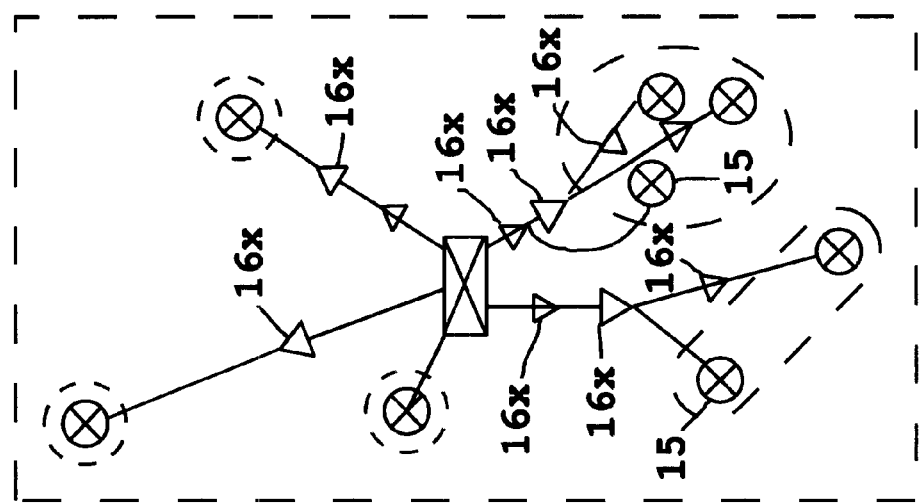
Figure 10.0
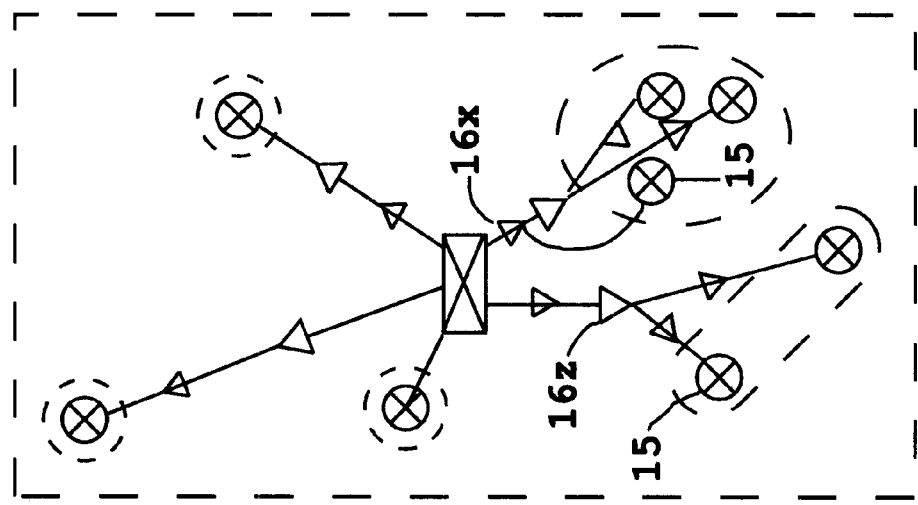
Figure 9.0

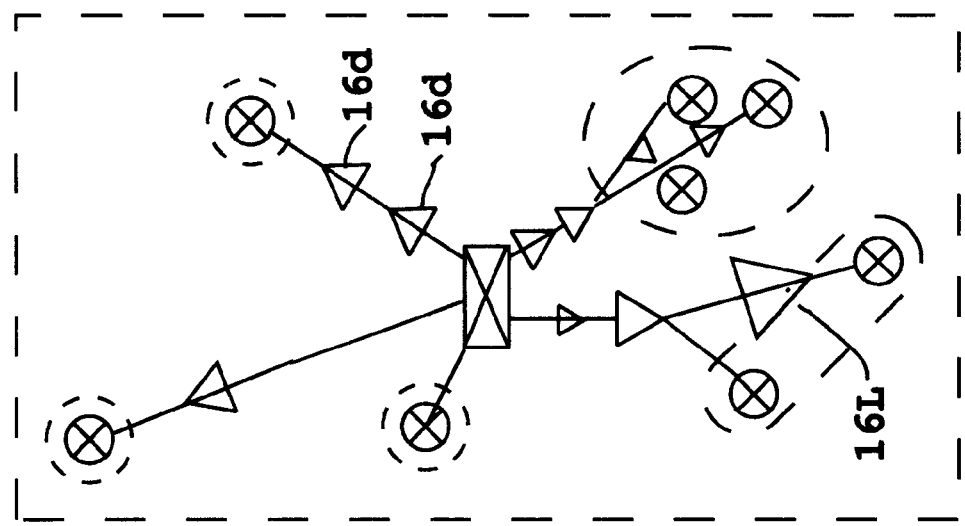
Figure 12
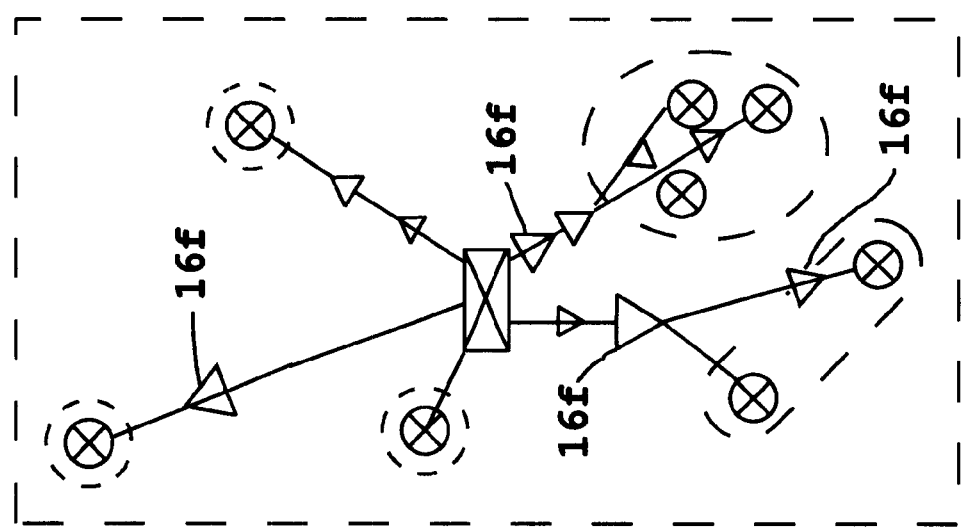
Figure 11.0

SYSTEM AND METHOD FOR AUTOMATIC INSERTION AND PLACEMENT OF REPEATER BUFFERS ON AN INTEGRATED CIRCUIT FLOOR PLAN

TECHNICAL FIELD

The present invention relates to integrated circuit chip design. More particularly the present invention relates to integrated circuit chip design systems and methods for placement of repeaters on the floor plan of an integrated circuit chip. Even more particularly, the present invention relates to integrated circuit chip design systems and automated methods for placement of repeater buffers on the floor plan of an integrated circuit chip design.

BACKGROUND OF THE INVENTION

It is known that propagation delays are not desirable in the design of next generation microprocessors and must be factored in the chip design to minimize the interconnect delay. See generally U.S. Pat. No. 5,910,747 to Matta et al., assigned to the assignee of the present invention. The propagation delays are physical phenomenon associated with interconnect resistivity of the metals comprising the interconnects, capacitive coupling associated with proximity of the interconnects to other interconnects, and the non-linear effects associated with the geometry of the chip. Since a chip design comprises millions of interconnects, the propagation delay problem becomes a significant obstacle to next-generation microprocessor design. Thus, although the technology is resulting in smaller and smaller geometries, the propagation delays are increasing due to the large magnitude of the interconnects (nets). It is known in the art, as U.S. Pat. No. 5,910,747 describes, that propagation delays are due to the need for an input signal driver to charge a resistive-capacitive (RC) circuit formed by the complex interconnect network distributed throughout the chip. The multitude of RC circuits are thus charged by drivers, and by additional drivers, which effectively speed up the charging time for the RC circuits. The use of a repeater buffer driver depends on whether the charging time for the RC circuit formed by the interconnect, or by the receiving load, exceeds a threshold value critical to the chip design. The buffer drivers are cascaded inverting or non-inverting amplifiers. It is also known, as U.S. Pat. No. 5,910,747 describes, that to further speed up the charging of the RC circuits formed by the interconnect, single stage inverting amplifiers, known as repeaters, are utilized. Repeaters serve to provide additional drive current for long interconnect segments. U.S. Pat. No. 5,910,747 teaches a recursive computer aided design (CAD) program for placing drivers in a net in a recursive fashion to isolate a branch interconnect from a parent interconnect, and thus reduce the overall charging time. U.S. Pat. No. 5,910,747 further teaches that by evenly placing repeaters in forkless branches, i.e. an interconnect terminating at a receiver, or load, the charging times are further decreased. U.S. Pat. No. 5,910,747 teaches a formula, k, for an interconnect segment in an unforking branch, to determine the number of repeaters. The formula k is related to the resistance and capacitance in an equivalent circuit of an unforking interconnect branch.

Other prior art methods include manually placing repeater buffers on a chip floor plan, whereby an engineer utilizes a CAD layout of the design to select where to place the repeaters. While, effective to reduce the propagation delays, the manual method does not optimally place the repeaters at near optimal distance from one another. Also, the manual method is not the most efficient in designing a new product.

Thus, refinement in the art of repeater placement tools is seen to exist to give a near optimal placement of repeaters on the floor plan of a chip to decrease the propagation delays, and to continue providing efficient new product designs.

BRIEF SUMMARY OF THE INVENTION

Accordingly, the present invention provides a computer aided automated system in the form of a repeater placement tool for placing repeater buffers on a floor plan of an integrated circuit chip. More particularly, the repeater placement tool, of the present invention, provides a near optimal placement of repeaters on the floor plan of a chip. The tool utilizes an algorithm which uses a combination of approximate geometric placement with iterative heuristic improvements on the basic geometric layout. A rule-driven repeater-type update system is used to ensure that the strength, load, and other characteristics of the repeater buffer are correct, given the repeater location and the topology and loads of the nets. The method comprises the tool loading the locations of drivers and receivers, and grouping the drivers that are close together, as well as the receivers that are close together. A "center of gravity (CG)" is then computed for each group of nets in a bus that are located close to one another. This CG is the receiver, or driver, that is closest to the center of the distribution of elements in the group. The tool allows for the specification of a maximum spread distance so if the drivers, or receivers, of a particular bus are distributed over too large an area, two or more [center of gravities] CGs will be found and repeated separately. The tool places repeaters to boost the signal on nets from the driver groups to the receiver groups. This placement is done to a first approximation using a geometric grouping algorithm. One driver CG is addressed at a time and the receiver CG(s) are grouped with respect to their angular proximity in relation to the driver CG. Repeaters are then placed to service each of these angle groups. This repeater placement is done by placing the repeater along the angle central to the subtending solid angle that defines the grouping. The distance at which it is placed is as far from the driver as possible (a parameter which is a function of the user defined maximum distance serviceable for the different types of repeater buffer). The algorithm is recursive so it then performs the same operation on each of the newly placed repeaters. The algorithm is run on each of the angle groupings with the repeater for a particular group being treated as a driver and the CG(s) in the angle grouping all being all the receivers to be driven.

To achieve a better configuration, a number of heuristic improvements are then applied to the results of the geometric grouping algorithm. These heuristic improvements involve removing repeaters that are too close to receiver CG(s) and moving the previous repeater in the net in order to fill the longer distance from the removed repeater. The tool also attempts to reconnect a receiver CG to a repeater farther back in the repeater chain servicing it so as to reduce the delay introduced by making a net go through too many repeater buffers.

The final stage of the algorithm is a rule based update mechanism that assigns a type to each repeater. The assignment is based on various requirements like the length of wire the repeater must drive, the maximum allowable propagation delay, and input load. The user can define all these parameters and specify the type which should be assigned to each repeater in the layout based on the configuration of all the drivers/receivers/repeaters and requirements on the individual nets.

Other features of the present invention are disclosed or are apparent in the section entitled: "DETAILED DESCRIPTION OF THE INVENTION."

BRIEF DESCRIPTION OF DRAWINGS

The invention, including its various features and advantages, may be more readily understood with reference to the following detailed description of the best mode for carrying out the invention taken in conjunction with the accompanying drawings as follows. Reference numbers refer to the same or equivalent parts of the present invention throughout the several figures of the drawings.

FIG. 1.0 is a top level layout representation of a integrated circuit chip floor plan design showing placement of drivers and receivers which have been pre-determined to need optimization for decreasing propagation delays in the design, in accordance with the present invention.

FIG. 2.0 is a top level chip floor plan design of FIG. 1.0 configured using a center of gravity geometric representation for groups of drivers and receivers such as for bussed nets, in accordance with the present invention.

FIG. 3.0 is a geometric representation of an angular proximity relationship between drivers and receivers as generated in the geometric representation shown in FIG. 2.0 showing repeaters servicing respective angle groups, in accordance with the present invention.

FIG. 4.0 is a geometric representation of repeaters placed to service each of the angle groups shown placed at a distance based on type of repeater buffer, in accordance with the present invention.

FIG. 5.0 shows a partially completed geometric placement of repeaters after being manipulated by a recursive algorithm treating previously placed repeaters as drivers for the receiver groups, in accordance with the present invention.

FIG. 6.0 shows a completed first stage geometric placement of repeaters servicing respective angle group of receivers, in accordance with the present invention.

FIG. 7.0 shows a placement of drivers, repeaters, and receivers after being configured in accordance with the first stage geometric grouping algorithm for being further manipulated by a second stage iterative heuristic improvement feature, in accordance with the present invention.

FIG. 8.0 shows a first optimization placement of drivers, repeaters, and receivers after being manipulated by a second stage iterative heuristic improvement feature, wherein repeaters which are too close to a receiver center of gravity are removed and the next closest repeater is moved closer to compensate, in accordance with the present invention.

FIG. 9.0 shows a second optimization placement of drivers, repeaters, and receivers after being manipulated by a second stage iterative heuristic improvement feature, wherein receivers too close to a repeater servicing multiple receivers are reconnected a repeater located farther back, in accordance with the present invention.

FIG. 10.0 shows a third optimization placement of drivers, repeaters, and receivers after being manipulated by a second stage iterative heuristic improvement feature, wherein a repeater which is still too close to a receiver being serviced is removed, in accordance with the present invention.

FIG. 11.0 shows a placement of drivers, repeaters, and receivers after being configured in accordance with the second stage iterative heuristic improvement feature for being further manipulated by a third stage rule-driven repeater-type assignment feature factoring spatial configuration of components, in accordance with the present invention.

FIG. 12.0 shows a placement of drivers, repeaters, and receivers after being configured in accordance with the second stage iterative heuristic improvement feature further manipulated by a third stage rule-driven repeater-type assignment feature to improve repeater performance based on user defined parameters other than spatial placement, including speed and loading considerations, in accordance with the present invention.

DETAILED DESCRIPTION OF THE INVENTION

Figure 1A:
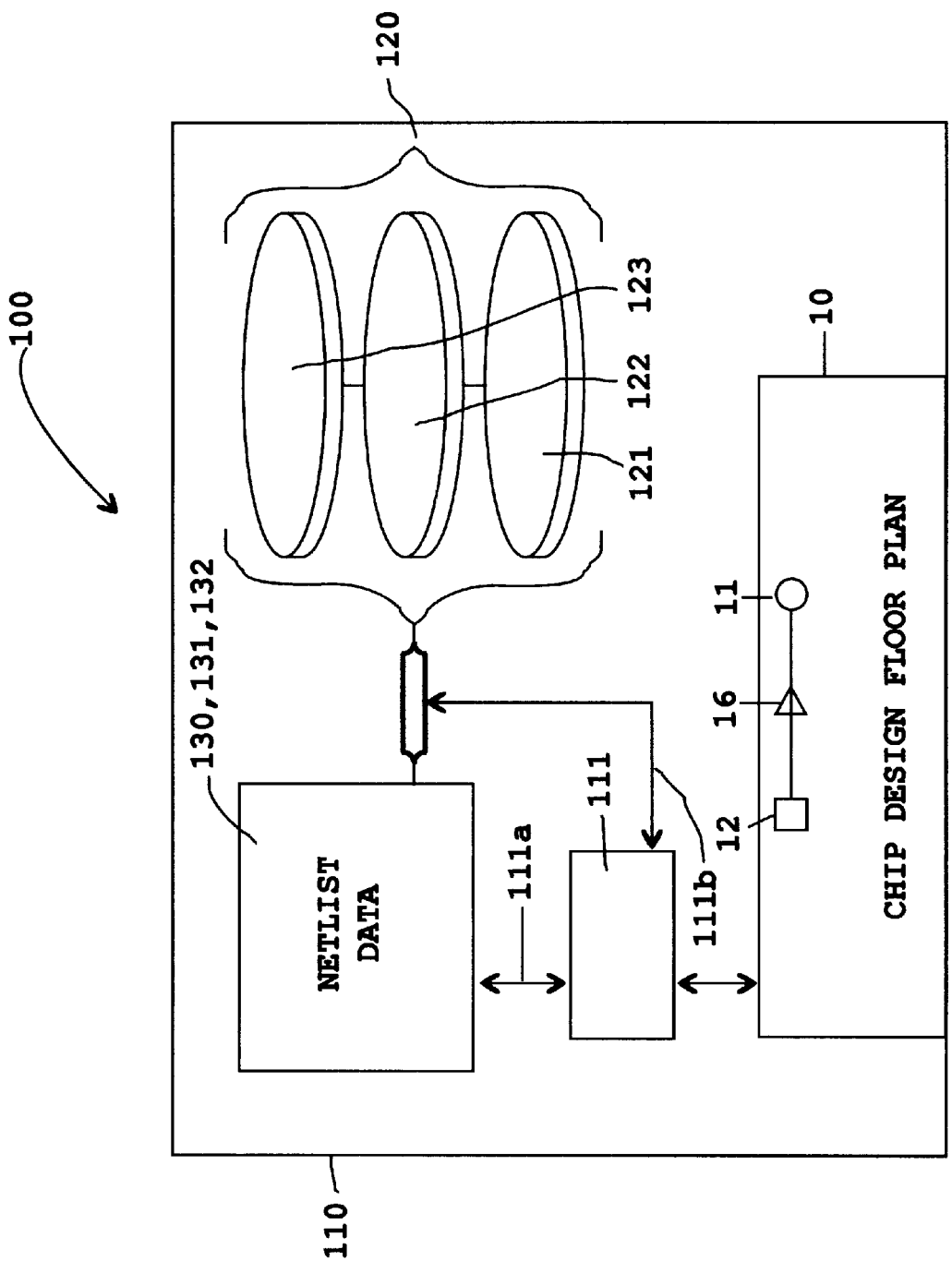
FIG. 1A shows an automated system for placement of repeater buffers on a floor plan of an integrated circuit chip design, in accordance with the present invention.

As will be described in more detail below, FIG. 1A shows an automated system 100 for placement of repeater buffers 16 between drivers 12 and receivers 11 on a floor plan 10 of an integrated circuit chip design represented by a hierarchical level netlist data 130. System 100 includes a computer aided design tool 110 which manipulates the provided netlist data 130. Netlist data 130 is accessible and manipulated by a tool processor 111, via path 111a. Netlist data 130 includes a net location of drivers and receivers, generally designated by the numerals 12 and 11, respectively. Further, netlist 130 includes data concerning net propagation time delay that indicates a need for design optimization to further decrease propagation delays in the chip design. The present invention incorporates an algorithm 120 for manipulation of netlist data 130 by processor 111, via path 111b. Algorithm 120 comprises a first set of software 121, a second set of software 122, and a third set of software 123. The first set of software 121 is utilized to manipulate netlist data 130 for geometrically, and recursively placing a plurality of repeaters on a group of nets between software generated drivers and receivers, see generally FIGS. 1 through 6. The plurality of repeaters determined by software 121 are an optimized, first approximation placement of repeaters and comprise a first approximation netlist data, generally designated by the numeral 131 in FIG. 1A. The second set of software 122 is utilized for manipulating the first approximation netlist data 131 and generating a heuristically improved configuration data of repeater placement, generally designated as 132 in FIG. 1A. The heuristically improved configuration of repeater placement data 132 is illustrated in FIGS. 7.0 through 10.0. The third set of software 123 is used for manipulating the heuristically improved configuration of repeater placement data 132 for assigning a type designation to each repeater in said heuristically improved configuration of repeater placement, see generally FIGS. 11.0 and 12.0, based on a rule table.

Tool 110 and its processor 111 utilizes algorithm 120 which uses a combination of approximate geometric placement, software 121, with iterative heuristic improvements, software 122, on the basic geometric layout represented by netlist data 130. A rule-driven repeater-type update routine, software 123 is used to ensure that the strength, load, and other characteristics of the repeater buffer are correct, given the repeater location and the topology and loads of the nets. As illustrated in FIG. 1.0, tool 110 utilizes software 121 to establish the locations of drivers 12 and receivers 11 from netlist 130 which represents the basic geometric floor plan 10 of a semiconductor chip. As illustrated in FIG. 1.0, software 121 groups drivers 12 that are close together, as well as receivers 11 that are close together. As shown in FIG. 2.0, software 121 then computes a center of gravity (CG) for each group of nets in a bus that are located close to one another. This center of gravity is the receiver 13, or driver 14, that is closest to the center of the distribution of elements in the group of nets in a bus. The manipulations by processor 111 allows for the specification of a maximum spread distance so if the drivers, or receivers, of a particular bus are too spread out, two or more center of gravities will be found and repeated separately. As shown in FIG. 3.0, tool 110, utilizing using geometric grouping algorithm software 121, then places repeaters 16 as shown to boost the signal on nets from a driver group 14 to the various receiver groups 15. This placement is done to a first approximation by software 121. As generally shown in FIG. 3.0, software 121 addresses one driver CG 14 at a time and then groups a receiver CG 15 with respect to their angular proximity A about an x-y axis in relation to driver CG 14. Repeaters 16 are then placed to service each of these angle groups. This repeater placement is done by placing the repeater along the angle A which is central to the subtending solid angle B that defines a grouping. The distance at which a repeater 16 is placed is as far from a driver 14 as possible. This distance parameter is a function of the user defined maximum distance serviceable for the different types of repeater buffer. As shown in FIG. 4.0, and since software 121 is recursive, the processor 111 then performs the same operation again as was done for placing each of the repeaters 16 shown in FIG. 3. Thus, as shown in FIG. 4.0, repeaters 16a are placed to boost the signal on nets from a driver group 14a to the various receiver groups 15. The recursive aspect of the software 121 also applies to the grouping of receiver center of gravity, see generally FIG. 5.0, where receiver groups 15a are serviced by multiple repeaters 16y, and which need for further recursive treatment by software 121. FIG. 5.0 also illustrates a completed state of recursive treatment by software 121, where single receiver groups 15 are serviced by a recursively determined repeater 16x. FIG. 6 shows a completed state for the recursive treatment by software 121 for all receiver groups 15 as serviced by the finally placed repeaters 16x.

To achieve a better configuration of repeater placement, a number of heuristic improvements are then performed by software 122 to the results shown in FIG. 6.0 which were performed by the geometric grouping algorithm (software 121). As seen in FIGS. 7.0, 8.0, 9.0, and 10.0, these heuristic improvement steps involve removing repeaters 16z that are too close to receiver CG(s) 15, 15a and moving the previous repeater 16x in the net in order to fill the longer distance from the removed repeater 16z. As shown in FIGS. 9.0 and 10.0, the tool also attempts to reconnect a receiver CG 15 to a repeater 16x farther back in the repeater chain servicing it so as to reduce the delay introduced by making a net go through too many repeater buffers. FIGS. 9.0 and 10.0 also show the situation where if a repeater 16z is still too close to a receiver CG 15 and the repeater 16z is only servicing the one receiver CG 15, then the repeater 16z is removed.

FIGS. 11.0 and 12.0 show the final stages of the method of the present invention where software 123 algorithm is a rule based update mechanism that manipulates the heuristically improved configuration of repeater placement shown in FIG. 10 for determining and assigning a repeater-type designation to each repeater 16x. The assignment by software 123 is based on various requirements of the chip design and includes parameters such as the length of wire the repeater must drive, the maximum allowable propagation delay, and input load to a receiver. The user can define all these parameters and specify the type which should be assigned by software 123 to each repeater in the layout. By example, FIG. 11.0 shows repeaters 16f as upgraded-type receivers that are stronger repeaters than repeaters 16x shown in FIG. 10.0. Software 123 assigns repeaters 16f in order to drive a longer wire distance (i.e., an assignment based on a spatial configuration). Also by example, FIG. 12 shows repeaters 16d assigned by software 123 based on a need to select repeaters types that make the net faster due to a short propagation delay characteristic of the net. FIG. 12 also shows repeater 16L that is assigned by software 123 based on the situation where a repeater must drive a particularly large receiver load. Repeater 16L is a repeater-type that is rated to adequately drive the receiver load requirements.

The present invention has been particularly shown and described with respect to a certain preferred embodiments and features thereof. However, it should be readily apparent to those of ordinary skill in the art that various changes and modifications in form, semiconductor material, and fabrication material detail may be made without departing from the spirit and scope of the inventions as set forth in the appended claims.

What is claimed is:

1. An automated system for placement of at least one repeater buffer on a floor plan of an integrated circuit chip design, said system comprising:

a computer aided design tool;

netlist data of said chip design, said netlist data being accessible by said tool and including a location of at least one driver and at least one receiver, said netlist data comprising net propagation time delay data indicating need for optimization to further decrease a propagation delay in the chip design; and an algorithm for manipulating said netlist data, said algorithm comprising:

a first set of software for geometrically and recursively placing at least one repeater on a group of nets between a software-generated driver placement and a software-generated receiver placement, said at least one repeater comprising:

an optimized first approximation repeater placement; and first approximation netlist data;

a second set of software for manipulating said first approximation netlist data and for generating a heuristically-improved configuration of said repeater placement; and a third set of software for assigning a type designation to each said at least one repeater via at least one rule with user-defined parameters in said heuristically-improved configuration of said repeater placement, wherein said group of nets comprises a geometric grouping, by said first set of software, such that said repeater placement is grouped with respect to an angular proximity in relation to said software-generated driver placement.

2. An automated system, as recited in claim 1, wherein said software-generated driver placement and said software-generated receiver placement respectively comprise a plurality of center of gravity geometric representations of said at least one driver and a plurality of center of gravity geometric representations of said at least one receiver.

3. An automated system, as recited in claim 1, wherein said at least one repeater in said heuristically-improved configuration of said repeater placement comprises a repeater type assigned in accordance with a set of requirements, said requirements set comprising:

a length of a wire that each said at least one repeater must drive;

a maximum allowable propagation delay in a net; and a respective receiver input load.

4. An automated system for placement of at least one repeater buffer on a floor plan of an integrated circuit chip design, said system comprising:

a computer aided design tool;

netlist data of said chip design, said netlist data being accessible by said tool and including a location of at least one driver and at least one receiver, said netlist data comprising net propagation time delay data indicating a need for optimization to further decrease a propagation delay in the chip design; and an algorithm for manipulating said netlist data, said algorithm comprising:

a first set of software for geometrically and recursively placing at least one repeater on a group of nets between a software-generated driver placement and a software-generated receiver placement, said software-generated driver placement and said software-generated receiver placement respectively comprising a plurality of center of gravity geometric representations of said at least one driver and a plurality of center of gravity geometric representations of said at least one receiver, said at least one repeater comprising:

an optimized first approximation repeater placement; and first approximation netlist data;

a second set of software for manipulating said first approximation netlist data and for generating a heuristically-improved configuration of said repeater placement; and a third set of software for assigning a type designation to each said at least one receiver via at least one rule with user-defined parameters in said heuristically-improved configuration of said repeater placement, wherein said group of nets comprises a geometric grouping, by said first set of software, such that each said at least one receiver's centers of gravity are grouped with respect to their angular proximity in relation to a driver center of gravity.

5. An automated system, as recited in claim 4, wherein said at least one repeater in said heuristically-improved configuration of said repeater placement comprises a repeater-type assigned in accordance with a set of requirements, said requirements set comprising:

a length of a wire that each said at least one repeater must drive;

a maximum allowable propagation delay in a net; and a respective receiver input load, each said requirement being modifiable using said tool.

6. An automated method for placing at least one repeater buffer on a floor plan of an integrated circuit chip design, said method comprising the steps of:

(a) providing a computer aided design tool;

(b) providing netlist data of said chip design, said netlist data being accessible by said tool and including a location of at least one driver and at least one receiver, said netlist data comprising net propagation time delay data indicating a need for optimization to further decrease a propagation delay in the chip design;

(c) providing an algorithm for manipulating said netlist data, said algorithm comprising:

a first set of software for geometrically and recursively placing at least one repeater on a group of nets between a software-generated driver placement and a software-generated receiver placement, said at least one repeater comprising an optimized first approximation placement of repeaters and comprising a first approximation netlist data;

a second set of software for manipulating said first approximation netlist data and generating a heuristically-improved configuration of said repeater placement; and a third set of software for assigning a type designation to each said at least one repeater in said heuristically-improved configuration of said repeater placement;

(d) accessing said netlist data by said tool and locating a location of said at least one driver and said at least one receiver comprising a net propagation time delay indicating a need for optimization to further decrease a propagation delay in the chip design;

(e) manipulating said netlist data by said first set of software, geometrically and recursively determining a first approximation repeater placement, and generating said first approximation netlist data, (f) manipulating said generated first approximation netlist data, and generating a heuristically-improved configuration of said repeater placement; and (g) manipulating said heuristically-improved configuration of said repeater placement, and determining and assigning a repeater-type designation to each said at least one repeater through a set of rules with parameters defined by the user, wherein said step (e) of manipulating said netlist data, by said first set of software, comprises a step of grouping said at least one driver and said at least one receiver, by said first set of software, such that each said at least one receiver's centers of gravity are grouped with respect to their angular proximity in relation to a driver center of gravity.

7. An automated method, as recited in claim 6, wherein said step (f) comprises:

removing said at least one repeater which is too close to each said at least one receiver's at least one center of gravity, and moving at least one previous repeater in each said net in order to optimize a distance between the at least one moved previous repeater and the at least one driver as well as a distance between the at least one moved previous repeater and each said at least one receiver's at least one center of gravity; and reconnecting each said receiver's at least one center of gravity to said at least one moved previous repeater farther back in a repeater chain servicing each said at least one receiver, by providing an additional drive current, in order to reduce the propagation delay.

8. An automated method, as recited in claim 6, wherein said step (g) comprises assigning a repeater-type in accordance with a set of requirements, said requirements set comprising:

a length of a wire that each said at least one repeater must drive;

a maximum allowable propagation;

a maximum input load; and other user-defined rules.

\* \* \* \* \*